United States Patent
Hosaka et al.

(10) Patent No.: US 6,818,839 B2
(45) Date of Patent: Nov. 16, 2004

(54) ELECTRIC CONTACT AND AN ELECTRIC CONNECTOR BOTH USING RESIN SOLDER AND A METHOD OF CONNECTING THEM TO A PRINTED CIRCUIT BOARD

(75) Inventors: Taiji Hosaka, Yokohama (JP); Masaaki Miyazawa, Kawasaki (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 244 days.

(21) Appl. No.: 10/114,188

(22) Filed: Apr. 1, 2002

(65) Prior Publication Data

US 2002/0139580 A1 Oct. 3, 2002

(30) Foreign Application Priority Data

Mar. 30, 2001 (JP) ........................................ 2001-102648

(51) Int. Cl.[7] .......................... H01R 12/04; H05K 1/11
(52) U.S. Cl. ........................................ 174/262; 439/65
(58) Field of Search ................................ 174/262–266; 361/792–795, 803; 438/65–75

(56) References Cited

U.S. PATENT DOCUMENTS

| | | | |
|---|---|---|---|
| 3,660,726 A | 5/1972 | Ammon et al. | |
| 3,822,107 A | 7/1974 | Wogerer | |
| 3,914,081 A | 10/1975 | Aoki | |
| 3,971,610 A | * 7/1976 | Buchoff et al. | 439/75 |
| 3,978,378 A | 8/1976 | Tigner et al. | |
| 4,315,724 A | 2/1982 | Taoka et al. | |
| 4,398,785 A | 8/1983 | Hedrick | |
| 4,666,547 A | 5/1987 | Snowden, Jr. et al. | |
| 4,778,556 A | 10/1988 | Wery et al. | |
| 4,838,799 A | 6/1989 | Tonooka | |
| 4,863,392 A | 9/1989 | Borgstrom et al. | |
| 4,926,548 A | 5/1990 | Hopkins et al. | |
| 5,129,143 A | 7/1992 | Wei et al. | |
| 5,163,856 A | 11/1992 | McGaffigan et al. | |
| 5,347,711 A | 9/1994 | Wheatcraft et al. | |

(List continued on next page.)

FOREIGN PATENT DOCUMENTS

| | | |
|---|---|---|
| DE | 3824314 | 2/1989 |
| DE | 3914959 | 11/1989 |
| DE | 4012061 | 10/1991 |
| DE | 19808178 | 9/1998 |
| DE | 19937100 | 2/2000 |

(List continued on next page.)

OTHER PUBLICATIONS

"Electric Connecting Device and Electric Connector Using Resin Solder and Method of Connecting Electric Wire to Them". by Taiji Hosaka et al.; U.S. patent application 10/114,799, Apr. 1, 2002. pp. 1 to 48 and 30 sheets of drawings.

(List continued on next page.)

*Primary Examiner*—Kamand Cuneo
*Assistant Examiner*—Jeremy Norris
(74) *Attorney, Agent, or Firm*—W. F. Fasse; W. G. Fasse

(57) ABSTRACT

An electric contact using resin solder is connected to a printed circuit board without requiring soldering work. The circuit board has a conductor on a surface or in an intermediate layer thereof, and a through hole or a concaved part that penetrates the conductor. The electric contact includes a protruding part, which is inserted into the through hole or the concaved part, and a connecting part, which is connected to a conductor of a counterpart member such as a counterpart second circuit board. At least a part of the protruding part that connects to the conductor of the printed circuit board is made of a lead-free ultrahigh-conductive plastic resin composite. An electric connector includes the electric contact and an insulating housing, which holds the electric contact so that the protruding part and the connecting part thereof protrude outwardly.

20 Claims, 11 Drawing Sheets

U.S. PATENT DOCUMENTS

| | | | |
|---|---|---|---|
| 5,357,074 A | 10/1994 | Pawlikowski | |
| 5,386,085 A | 1/1995 | Miehls et al. | |
| 5,427,546 A | 6/1995 | Garritano et al. | |
| 5,517,747 A | 5/1996 | Pierro et al. | |
| 5,558,538 A | 9/1996 | Delalle | |
| 5,626,483 A | 5/1997 | Naitoh | |
| 5,656,798 A | 8/1997 | Kubo et al. | |
| 5,673,480 A | 10/1997 | Buchheister, Jr. et al. | |
| 5,772,454 A | 6/1998 | Long, Jr. | |
| 5,800,211 A | 9/1998 | Stabile et al. | |
| 5,898,991 A | 5/1999 | Fogel et al. | |
| 5,959,829 A | 9/1999 | Stevenson et al. | |
| 5,969,952 A | 10/1999 | Hayashi et al. | |
| 6,137,056 A | 10/2000 | Miyazaki | |
| 6,159,046 A | 12/2000 | Wong | |
| 6,163,957 A * | 12/2000 | Jiang et al. | 29/852 |
| 6,176,744 B1 | 1/2001 | Zito et al. | |
| 6,179,631 B1 | 1/2001 | Downes et al. | |
| 6,183,298 B1 | 2/2001 | Henningsen | |
| 6,183,311 B1 | 2/2001 | Suess et al. | |
| 6,194,669 B1 | 2/2001 | Bjorndahl et al. | |
| 6,239,385 B1 | 5/2001 | Schwiebert et al. | |
| 6,239,386 B1 | 5/2001 | DiStefano et al. | |
| 6,247,977 B1 | 6/2001 | Tanaka et al. | |
| 6,274,820 B1 | 8/2001 | DiStefano et al. | |
| 6,342,680 B1 | 1/2002 | Nakagawa et al. | |
| 6,388,204 B1 * | 5/2002 | Lauffer et al. | 174/261 |
| 6,465,084 B1 * | 10/2002 | Curcio et al. | 428/209 |
| 6,638,607 B1 * | 10/2003 | Curcio et al. | 429/209 |

FOREIGN PATENT DOCUMENTS

| | | |
|---|---|---|
| EP | 0576785 | 1/1994 |
| EP | WO97/50149 | 12/1997 |
| EP | 0831565 | 3/1998 |
| GB | 256377 | 8/1926 |
| GB | 2218580 | 11/1989 |
| GB | 2340674 | 2/2000 |
| JP | 61173473 | 9/1986 |
| JP | 09274972 | 10/1997 |
| JP | 10237331 | 9/1998 |
| JP | 2597015 | 4/1999 |

OTHER PUBLICATIONS

"A Binding Member for Coaxial Cable and an Electric Connector for Coaxial Cable Both Using Resin Solder, and a Method of Connecting the Binding Member to Coaxial Cable or the Electric Connector", by Taiji Hosaka et al. U.S. patent application 10/114,198; Apr. 1, 2002; pp. 1 to 33 and 13 sheets of drawings.

"An Electric Connector for Twisted Pair Cable Using Resin Solder and a Method of Connecting Electric Wire to the Electric Connector"; by Taiji Hosaka et al.; U.S. patent application 10/114,197, Apr. 1, 2002; pp. 1 to 33 and 6 sheets of drawings.

"A Pair of Electric Connectors Using Resin Solder in One Connector", by Taiji Hosaka et al.; U.S. patent application 10/114,196; Apr. 1, 2002; pp. 1 to 32 and 10 sheets of drawings.

An Electric Contact and an Electric Connector Both Using Resin Solder and a Method of Connecting Them to A Printed Circuit Board by Taiji Hosaka et al., U.S. patent application 10/114,775; Apr. 1, 2002; pp. 1 to 46 and 18 sheets of drawings.

* cited by examiner

ELECTRIC CONTACT AND AN ELECTRIC CONNECTOR BOTH USING RESIN SOLDER AND A METHOD OF CONNECTING THEM TO A PRINTED CIRCUIT BOARD

BACKGROUND OF THE INVENTION

1. Field of the Invention

The present invention belongs to a field of electric contacts and electric connectors, and relates to an electric contact and an electric connector, which are mounted on a printed circuit board by inserting into a through hole or a concaved part of the printed circuit board.

2. Related Art

The so-called dip type electric contact is known. It is made of metal sheet and comprises a protruding part, which is inserted into a through hole in a printed circuit board, and a barrel, to which an electric wire is connected. This electric contact is mounted on a printed circuit board by inserting its protruding part into a through hole in the printed circuit board and soldering the protruding part to the conductor which is penetrated by the through hole.

When the above-mentioned conventional electric contact is to be mounted on a printed circuit board by soldering, molten solder will be applied to the protruding part. However, if another part is mounted close to the electric contact on the printed circuit board, it may be difficult or impossible to solder the electric contact. Further, if some electric contacts are held in a housing to make an electric connector, the housing may interfere and make it difficult to solder the electric contacts onto a printed circuit board. Moreover, this work of applying solder requires careful solder quality control, temperature control and the like, and the man-hours required for control are increased correspondingly. If the electric contact is microminiaturized to connect with, for example, a very fine wire (for example, American Wire Gauge size 36 falls in the category of very fine wire, and the diameter of this electric wire is approximately 0.12 mm), the work of applying molten solder to the protruding part cannot be done by an automatic machine, and it is necessary to do the work manually by a skilled worker. Hence the productivity is low, and this results in an increase in cost.

In that case, these problems may be solved by forming the protruding part so that it can be pressed into the through hole, and in turn, eliminating the need of soldering. Measures to secure a force for pressing the protruding part into the through hole include, for example, making the protruding part into a cylinder and making longitudinal slits in the cylinder to induce easier deformation of the cylinder, and providing the cylinder with ribs. However, such protruding parts may be difficult to work on and produce, and even if they can be produced, they pose a problem of high cost because complicated working processes are required.

Now, Japanese Patent unexamined publication gazette Heisei 10-237331 discloses a lead-free ultrahigh-conductive plastic being a conductive resin composite, comprising a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal.

SUMMARY OF THE INVENTION

This lead-free ultrahigh-conductive plastic exhibits high conductivity, for example, $10^{-3}\Omega\cdot cm$ or under in volume resistivity. Moreover, this material can be molded by injection molding and has a high degree of freedom in molding. Furthermore, as this material contains solder, there is no need of separately applying solder. One objective of the present invention is to provide an electric contact and an electric connector, which can solve the above-mentioned problems, and a method of connecting these electric contact and electric connector to a printed circuit board by utilizing the lead-free ultrahigh-conductive plastic, which has such excellent conductivity and moldability and contains solder.

To accomplish the above-mentioned objective, an electric contact using resin solder according to the present invention is the electric contact, which is connected to a printed circuit board, which has a conductor being provided on a surface or in an intermediate layer and a through hole or a concaved part, which penetrates the conductor, the electric contact comprises a protruding part, which is inserted into the through hole or the concaved part, and a connecting part, which is connected to a conductor of a counterpart member, and at least a part of the protruding part, which connects to the conductor of the printed circuit board, is made of a lead-free ultrahigh-conductive plastic being a conductive resin composite, comprising a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal.

When the protruding part of this electric contact is inserted into a through hole or a concaved part of the printed circuit board and the protruding part is heated, the lead-free solder being contained in the lead-free ultrahigh-conductive plastic of the protruding part will melt out and stick to the conductor of the printed circuit board. When the solder cools and solidifies, the electric contact will be mounted on the printed circuit board. Hence the work of separately applying solder is not required. Accordingly, even when it is difficult or impossible to solder the electric contact, for example, when another part is mounted too close to the electric contact, the electric contact can be mounted on the printed circuit board. Moreover, as solder quality control, temperature control and the like are not required, the control man-hour is reduced correspondingly. Further, even if the electric contact is microminiaturized, the mounting of the electric contact can be executed by an automatic machine. Hence the productivity is increased and the cost is reduced. The lead-free ultrahigh-conductive plastic exhibits high conductivity, as high as $10^{-3}\Omega\cdot cm$ or under in volume resistivity. Hence the electric resistance of the electric contact can be lowered. Moreover, after the connection of the electric wire, when electricity is passed at a normal level, the lead-free ultrahigh-conductive plastic will not melt out due to heat generation. Further, in comparison with the technology of MID (Molded Interconnection Devices, for example, refer to Registered Utility Model gazette no. 2597015), wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. This, in turn, allows passage of a larger current. Moreover, as the lead-free ultrahigh-conductive plastic can be molded by injection molding, it gives a greater freedom in molding. Hence it is easy to form a part or the entirety of the protruding part into a configuration which is suited to being pressed into a through hole, and this does not cause an increase in cost due to complication of the production processes. In such a case, the electric contact can be mounted on a printed circuit board by simply pressing the protruding part into the through hole. In that case, when the protruding part is heated, the strength of connection between the protruding part and the conductor of the printed circuit board will be enhanced by the above-mentioned connecting function of the lead-free solder. Moreover, as the degree of freedom in molding is high, it is easy to obtain impedance matching. When only a part of the electric contact is made of the lead-free ultrahigh-conductive plastic, if other parts are made of a conductive material of which strength and elasticity are higher than those of the lead-free ultrahigh-conductive plastic, such as a metal, the strength and elasticity of the electric contact will be increased.

DESCRIPTION OF PREFERRED EMBODIMENTS OF THE INVENTION

Figure 1:
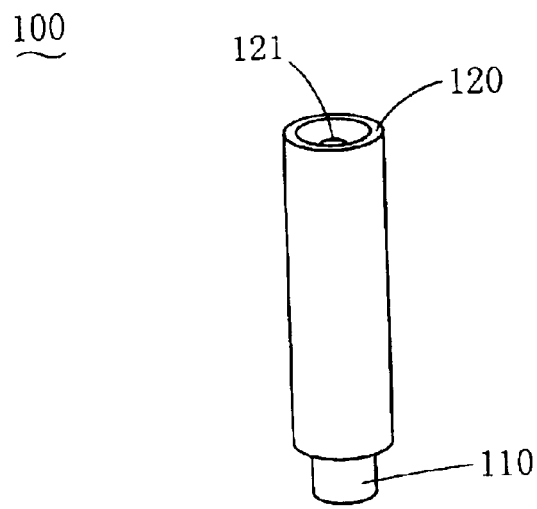
FIG. 1 is a perspective view of the electric contact of the first embodiment according to the present invention.

In the following, some embodiments of an electric contact and an electric connector both using resin solder and a method of connecting them to a printed circuit board according to the present invention will be described.

First, the above-mentioned lead-free ultrahigh-conductive plastic, which is commonly used in all the embodiments of the present invention, will be described in detail according to the description of Japanese Patent unexamined publication gazette Heisei 10-237331. This lead-free ultrahigh-conductive plastic is a conductive resin composite, which comprises a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal. This lead-free ultrahigh-conductive plastic includes those wherein lead-free solder parts that are finely dispersed in the above-mentioned thermoplastic resin are continuously connected to each other in the entire resin. The above-mentioned lead-free ultrahigh-conductive plastic includes those of which above-mentioned conductive resin composite has such a conductivity that the volume resistivity thereof is as low as $10^{-3}\Omega\cdot cm$ or under.

The synthetic resin to be used for this lead-free ultrahigh-conductive plastic is not specifically limited, and those that have been used conventionally can be used. However, from the viewpoints of ease in molding and some other physical properties required, it is preferable to use a thermoplastic resin.

The metal to be used for this lead-free ultrahigh-conductive plastic must be a lead-free metal that can half melt when the synthetic resin composite containing the metal is heat-plasticated. As the heat plastication temperature of thermoplastic resin is normally 350° C. or under, low-melting-point metals having a melting point below the above-mentioned plastication temperature are preferable. The metal may be a pure metal or an alloy. As the metal is kneaded under half-melted condition, its configuration is not limited particularly. However, a granular form or a powdery form of metal is preferable since it is easy to handle for dispersion.

Specific examples of the above-mentioned metal include zinc (Zn), tin (Sn), bismuth (Bi), aluminum (Al), cadmium (Cd), indium (In) and their alloys. Examples of preferred alloys among them include low-melting-point alloys such as Sn—Cu, Sn—Zn, Sn—Al and Sn—Ag.

Metals in powdery form for assisting dispersion of the solder include copper (Cu), nickel (Ni), aluminum (Al), chromium (Cr) and their alloys all in powdery form. The finer is the particle diameter of the metal powder, the finer is the dispersion of the solder after kneading. However, it is not necessary to provide powder of a common particle diameter. Powder of a metal having a distribution of particle diameters can be used. The usage of the metal components in the above-mentioned lead-free ultrahigh-conductive plastic is from 30 to 75% and preferably from 45 to 65 % in volume ratio to the entire conductive resin composite.

The above-mentioned lead-free ultrahigh-conductive plastic uses a resin and a low-melting-point alloy (lead-free solder) which does not contain lead from the viewpoint of environment. As they are kneaded when the metal is kept in a half-melted state, the lead-free solder being metal components can be dispersed finely throughout the resin. Moreover, as kneading is made when the lead-free solder is kept under a half-melted condition, the dispersed solder fractions are kept connected continuously to each other. This connection is not just a contact but a junction between solder fractions. As the conductivity thus achieved differs from that obtained by contacts among metal fractions, even if the molding is heated to a high temperature, the junctions will not break, thus the molding stably exhibits low resistance.

When this material is to be formed by injection molding, as the metal components are partly half-melted and the lead-free solder is finely dispersed, the material can be formed by injection molding into fine configurations although the material contains a large amount of metal components. Hence electric contacts and the like can be formed by processes of injection molding alone. Moreover, as no plating is required, a conductive part of low resistance can be formed inside the injection molding.

To produce the above-mentioned conductive resin composite, kneading machines and extruding machines for conventional resins can be used.

Next, embodiments of the above-mentioned lead-free ultrahigh-conductive plastic will be described.

Embodiment 1

45% by volume of ABS resin (produced by Toray; Toyolac 441), 40% by volume of lead-free solder (produced by Fukuda Kinzoku Hakufun Kogyo; Sn—Cu—Ni—AtW-150) and 15% by volume of copper powder (produced by Fukuda Kinzoku Hakufun Kogyo; FCC-SP-77, mean particle diameter 10 $\mu$m) were lightly mixed together and fed into a kneader (Moriyama Seisakusho make, double-screw pressurized type) which was set at 220° C. The mixture was kneaded, without preheating time, at a rate ranging from 25 to 50 r.p.m. for 20 minutes; the resin was heat-plasticated and the solder, under half-melted condition, was dispersed throughout the resin.

The kneaded material was pelletized by a plunger extrusion pelletizer (Toshin make, Model TP60-2) at the die temperature ranging from 200 to 240° C. to produce pellets. These pellets were used to carry out injection molding into molds by an injection molding machine (Kawaguchi Tekko make, KS-10B). The preset temperature was from 230 to 2800° C., and the mold temperature was from the ordinary room temperature to 150° C. The injection moldings obtained showed no sign of segregation of metal, and their surfaces were even.

Observation, under an optical microscope, of the state of dispersion of the solder of this injection molding showed that the solder was evenly dispersed throughout the resin and solder fractions were about 5 $\mu$m in size. The volume resistivity of this specimen was on the order of $10^{-5}\Omega\cdot cm$.

Embodiment 2

45% by volume of PBT resin (produced by Polyplastic), 40% by volume of lead-free solder (produced by Fukuda Kinzoku Hakufun Kogyo; Sn—Cu—Ni—AtW-150) and 15% by volume of copper powder (produced by Fukuda Kinzoku Hakufun Kogyo; FCC-SP-77, mean particle diameter 10 $\mu$m) were lightly mixed together and fed into the kneader (Moriyama Seisakusho make, double-screw pressurized type) which was set at 220° C. The mixture was kneaded, without preheating time, at a rate ranging from 25 to 50 r.p.m. for 20 minutes while efforts were made to prevent the temperature of the kneaded material from rising to 235° C. or over, by lowering the rate of revolution, cooling, etc.; the resin was heat-plasticated and the solder, under half-melted condition, was dispersed throughout the resin. Observation, under an optical microscope, of the state of dispersion of the solder of the kneaded material showed that the solder was evenly dispersed throughout the resin and solder fractions were about 5 $\mu$m in size.

Embodiment 3

35% by volume of ABS resin (produced by Toray; Toyolac 441), 55% by volume of lead-free solder (produced by Fukuda Kinzoku Hakufun Kogyo; Sn—Cu—Ni—AtW-150) and 10% by volume of copper powder (produced by Fukuda Kinzoku Hakufun Kogyo; FCC-SP-77, mean particle diameter 10 $\mu$m) were lightly mixed together, and the total of the metal components was set at 65% by volume. Then the mixture was fed into the kneader (Moriyama Seisakusho make, double-screw pressurized type) which was set at 220° C.

The kneaded material was pelletized by the plunger extrusion pelletizer (Toshin make, Model TP6-2) at the die temperature ranging from 200 to 240° C. to produce pellets. These pellets were used to carry out injection molding into molds by the injection molding machine (Kawaguchi Tekko make, KS-10B). The preset temperature of the machine was from 230 to 280° C., and the mold temperature was from the ordinary room temperature to 150° C. The injection moldings obtained showed no sign of segregation of metal, and their surfaces were even. Observation, under an optical microscope, of the state of dispersion of the solder showed that the solder was evenly dispersed throughout the resin and solder fractions were about 100 $\mu$m or under in size. The volume resistivity of this specimen was on the order of $4\times10^{-5}\Omega\cdot cm$.

As clearly shown by the above-mentioned specific examples, the lead-free solder could be dispersed finely throughout the resins, and even when a large volume of metal components as high as 65 % by volume were mixed, a kneaded material that did not show any segregation, under heating, of metals from the resin was obtained successfully. As the solder fractions were continuous to each other in this lead-free ultrahigh-conductive plastic, the conductivity of the plastic did not show any deterioration even when the temperature changed, thus the plastic stably exhibited high conductivity. In injection molding, the plastic was successfully molded into fine configurations without any clogging.

Figure 21:
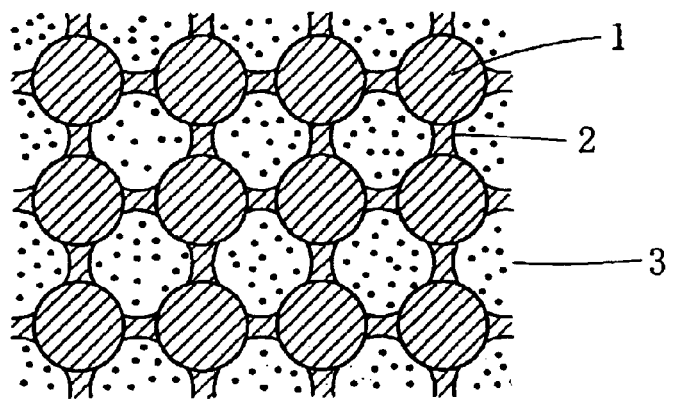
FIG. 21 is a schematic structural diagram of the lead-free ultrahigh-conductive plastic used in the embodiments.

With the use of this lead-free ultrahigh-conductive plastic, electric contacts and the like having a three-dimensional configuration and low resistance can be formed by injection molding. In the following, with reference to the attached drawings, specific examples will be described in detail. FIG. 21 is a schematic structural diagram of the above-mentioned lead-free ultrahigh-conductive plastic. As shown in this diagram, in this lead-free ultrahigh-conductive plastic, the lead-free solders 1 are connected to each other by the solders 2 which are melted in the plastic 3. Hence the lead-free solders 1 are junctioned to each other and the conductivity is high and the reliability of the connection is high.

Figure 22:
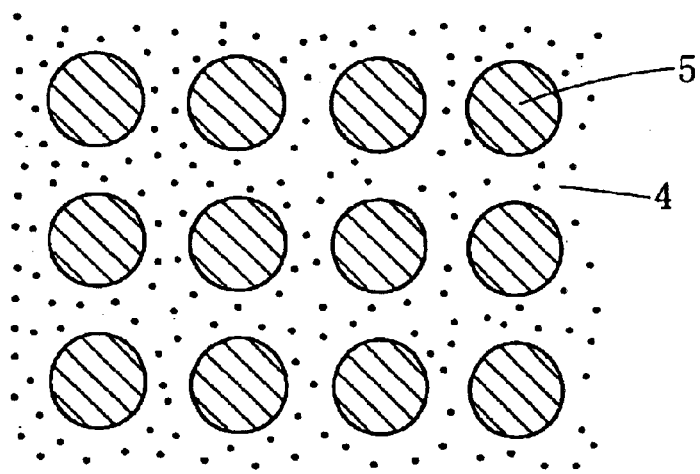
FIG. 22 is a schematic structural diagram of the conventional plastic wherein powder of a metal that does not melt is kneaded in a resin.

In contrast to this, as shown in FIG. 22, when powder 5 of a conventional metal that does not melt is kneaded in a plastic 4, the metal particles will not connect to each other unless a large amount of the metal content is mixed. Hence conductivity cannot be obtained.

Thus the lead-free ultrahigh-conductive plastic shows a low resistance, does not exhibit deterioration in conductivity in a variety of environments, and has a high reliability.

To sum up, when a resin and a low-melting-point alloy (lead-free solder) which does not contain lead from the viewpoint of environment are used, and they are kneaded with the metal being kept in half-melted condition, the lead-free solder being the metal components can be dispersed finely throughout the resin. Moreover, as kneading is made when the lead-free solder is kept in half-melted condition, the dispersed solder fractions are kept connected continuously to each other. This connection is not just a contact but a junction between solder fractions. As the conductivity thus achieved differs from that obtained by contacts among metal fractions, even if the molding is heated to a high temperature, the junctions will not break, thus the molding stably exhibits low resistance.

When this material is to be formed by injection molding, as the metal components are partly half-melted and the lead-free solder is finely dispersed, the material can be formed by injection molding into fine configurations although the material contains a large amount of metal components. Hence electric contacts and the like can be formed by processes of injection molding alone. Moreover, as no plating is required, a conductive part of low resistance can be formed inside the frame (injection molding).

Figure 2:
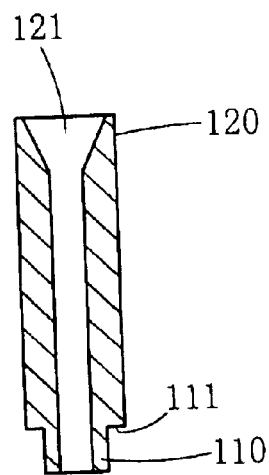
FIG. 2 is a sectional view of the electric contact of the first embodiment.
Figure 3:
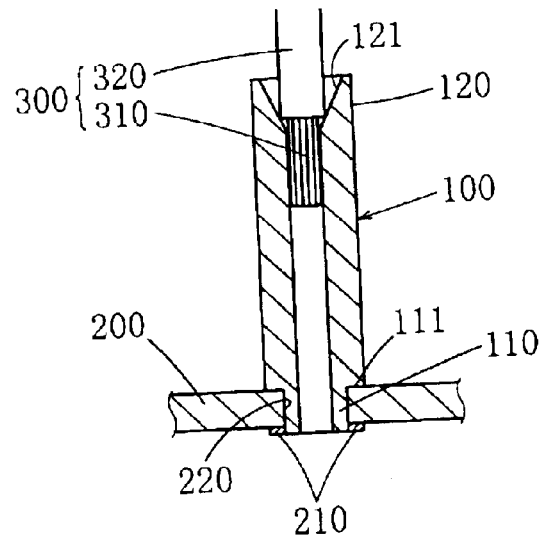
FIG. 3 is a sectional view of the electric contact of the first embodiment, which is mounted on a printed circuit board.
Figure 5:
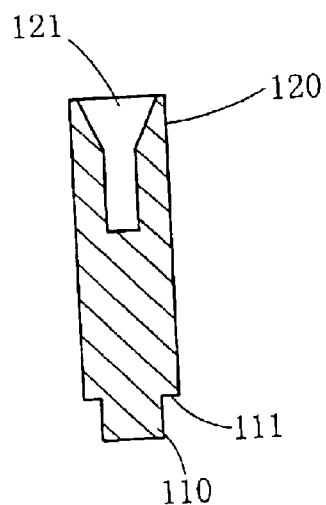
FIG. 5 is sectional view of a modification of the electric contact of the first embodiment.

Next, embodiments of the electric contact using the resin solder will be described. FIG. 1 and FIG. 2 show the electric contact 100 of the first embodiment. This electric contact 100 has conductivity and is connected to a printed circuit board 200. As shown in FIG. 3, the printed circuit board 200 has a conductor 210, which is provided on the surface thereof, and a through hole 220, which penetrates this conductor 210. As shown in FIG. 1 and FIG. 2, the electric contact 100 comprises a protruding part 110, which is inserted into the through hole 220, and a connecting part 120, which is connected to the conductor of the counterpart member. The present invention covers printed circuit boards wherein conductors are provided on the surface opposite to that of FIG. 3, printed circuit boards wherein conductors are provided on both surfaces of the boards, printed circuit boards wherein conductors are provided in an intermediate layer, and printed circuit boards wherein the boards have a concaved part that penetrates the conductor. In the case of a printed circuit board having a concaved part, the protruding part of the electric contact is inserted into the concaved part. The counterpart member is, for example, an electric wire, a printed circuit board or an electric contact. The counterpart member of this embodiment is an electric wire 300, and its conductor is the core wire 310. Hence the connecting part 120 is formed to connect the electric wire 300. In other words, the electric contact 100 is provided with a receiving hole 121 into which the core wire 310 of the electric wire 300 is inserted. The opening of the receiving hole 121 is formed conically, if necessary. This receiving hole 121 may penetrate the electric contact 100, or as shown in FIG. 5, it may be terminated halfway. The protruding part 110 is formed into a bar. It has such a length that when it is inserted into a through hole 220 of a printed circuit board 200, its top end will contact the conductor 210 of the printed circuit board 200. A positioning plane 111, which contacts the printed circuit board 200, is formed at the root of the protruding part 110 of the electric contact 100. The positioning plane 111 is formed by making a difference in level, but as will be described in relation to the third embodiment, the positioning plane 111 may be formed by providing a flange and using the surface of the flange. When the counterpart member is a printed circuit board, the conductor is a conductor which is provided on the surface or in an intermediate layer of the printed circuit board. When the counterpart member is an electric contact, the conductor is the contacting part of the electric contact. The electric contact 100 is entirely made of the lead-free ultrahigh-conductive plastic being the conductive resin composite. The present invention includes electric contacts wherein at least the part of the protruding part, which connects to the conductor of the printed circuit board, is made of the lead-free ultrahigh-conductive plastic, and other parts are made of another material that has conductivity.

Accordingly, as shown in FIG. 3, when the protruding part 110 of the electric contact 100 is inserted into the through hole 220 of the printed circuit board 200 and the protruding part 110 is heated, the lead-free solder being contained in the lead-free ultrahigh-conductive plastic of the protruding part 110 will melt out and stick to the conductor 210 of the printed circuit board 200. When the solder cools and solidifies, the electric contact 100 will be mounted on the printed circuit board 200. The above-mentioned heating is effected by, for example, blowing hot air or irradiating high frequency waves or laser beams to give thermal energy. Accordingly, the work of separately applying solder is not required. Thus even when it is difficult or impossible to solder the electric contact 100, for example, when another part is mounted too close to the electric contact 100, the electric contact 100 can be mounted on the printed circuit board 200. Moreover, solder quality control, temperature control and the like are not required, and the control manhour is reduced correspondingly. Even when the electric contact 100 is microminiaturized, the mounting of the electric contact 100 can be done by an automatic machine, and the productivity is enhanced and the cost is reduced. The lead-free ultrahigh-conductive plastic exhibits high conductivity, for example, $10^{-3}\Omega\cdot cm$ or under in volume resistivity. Hence the electric resistance of the electric contact 100 can be reduced. After the connection of the electric wire 300, when electricity is passed at a normal level, the lead-free ultrahigh-conductive plastic will not melt out due to heat generation. Moreover, in comparison with the technology of MID wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. This in turn allows passage of a larger current. As the lead-free ultrahigh-conductive plastic can be molded by injection molding, it gives a higher degree of freedom in molding. Hence it is easy to form a part or the entirety of the protruding part 110 into a configuration which is suited to being pressed into the through hole 220, and this does not cause an increase in cost due to complication of the production processes. In such a case, the electric contact 100 can be mounted on the printed circuit board 200 by simply pressing the protruding part 110 into the through hole 220. In that case, when the protruding part 110 is heated, the strength of connection between the protruding part 110 and the conductor 210 of the printed circuit board 200 will be enhanced by the above-mentioned connecting function of the lead-free solder. Moreover, as the degree of freedom in molding is high, it is easy to obtain impedance matching.

The electric contact 100 of the first embodiment is entirely made of the lead-free ultrahigh-conductive plastic. In contrast to it, when only a part of the electric contact is made of the lead-free ultrahigh-conductive plastic, if other parts are made of a conductive material of which strength and elasticity are higher than those of the lead-free ultrahigh-conductive plastic, such as a metal, the strength and elasticity of the electric contact will be increased. In that case, the electric contact 100 can be produced by insert molding, which is a kind of injection molding.

The present invention does not limit the configuration of the connecting part of the electric contact. Among the embodiments of the present invention, the connecting part 120 of the electric contact 100 of the first embodiment is provided with the receiving hole 121 for connecting the electric wire 300 to it. With this arrangement, the electric wire 300 is connected, via the electric contact 100, to the conductor 210 of the printed circuit board 200. In that case, if at least the part of the connecting part 120, to which the core wire 310 of the electric wire 300 is connected, is made of the lead-free ultrahigh-conductive plastic, the electric wire 300 can be connected to the connecting part 120 by the above-mentioned connecting function of the lead-free solder. Then the work of separately applying solder is not required, and even if it is difficult or impossible to solder, for example, when the connecting part 120 is at a recess of the electric contact 100, the electric wire 300 can be easily connected. Moreover, solder quality control, temperature control and the like are not required, and the control man-hour is reduced correspondingly. The connection of a very fine wire can be made by an automatic machine, and the productivity is enhanced and the cost is reduced. And a larger current can be passed. Furthermore, as the degree of freedom in molding is high, the part of the connecting part 120, which is made of the lead-free ultrahigh-conductive plastic, can be molded into a variety of configurations according to applications. Other modes of the connecting part 120 for connecting it to the electric wire 300 include a mode wherein the surface of the connecting part 120 is formed into a simple plane, a mode wherein a groove is provided, a mode wherein a barrel is provided, and a mode wherein crimping slots are provided. In the above-mentioned embodiment, the connecting part 120 is provided with the receiving hole 121, thus the workability of connecting the electric wire 300 is good. The workability is also good when the mode using a groove is adopted.

The present invention includes embodiments wherein there is no difference in level at the root of the protruding part. Among the embodiments of the present invention, the electric contact 100 of the first embodiment has the positioning plane 111, which contacts the printed circuit board 200, at the root of the protruding part 110. With this arrangement, when the protruding part 110 is inserted into the through hole 220 of the printed circuit board 200, the positioning plane 111 will contact the printed circuit board 200 and the protruding part 110 will not be inserted any more. Thus the length of insertion is neither too much nor too less, and the reliability of connection is enhanced.

Figure 4:
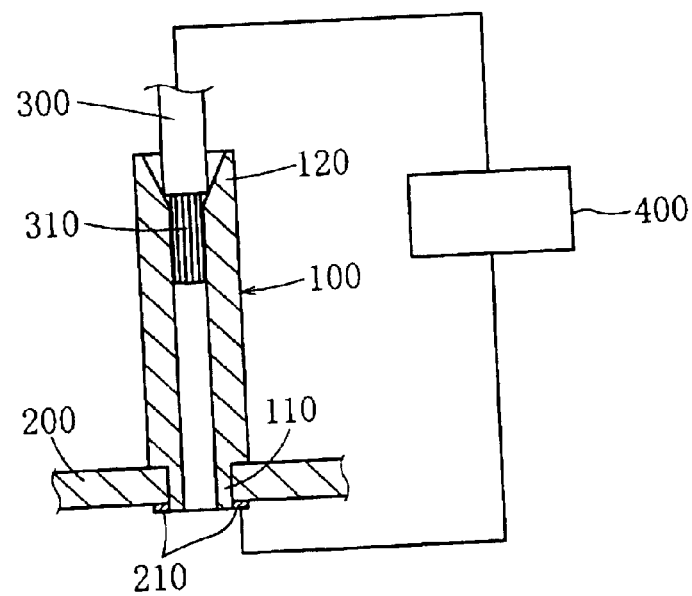
FIG. 4 is a schematic diagram showing another embodiment of the method of connecting the electric contact of the first embodiment to a printed circuit board.

Another embodiment of the method of connecting this electric contact 100 to the printed circuit board 200 will be described. As shown in FIG. 4, first, the protruding part 110 of the electric contact 100 is inserted into the through hole 220 of the printed circuit board 200. Next, electricity is passed between the electric contact 100 and the conductor 210 of the printed circuit board 200 by a power source 400 to melt the lead-free solder being contained in the protruding part 110 and connect the electric contact to the conductor 210.

When this connecting method is used, as the protruding part 110 generates heat by itself, even when it is difficult to externally heat the protruding part 110, the electric contact 100 can be connected to the conductor 210 of the printed circuit board 200. In this case, the two poles of the power source 400 are connected to the electric contract 100 and the conductor 210 of the printed circuit board 200, but as shown in FIG. 4, one pole may be connected to the core wire 310 of the electric wire 300, which is inserted into the connecting part 120. With this arrangement, in the case of this embodiment, as the connecting part 120 is also made of the lead-free ultrahigh-conductive plastic, the lead-free solder being contained in the connecting part 120 will melt and connect the core wire 310 to the connecting part 120.

Figure 6:
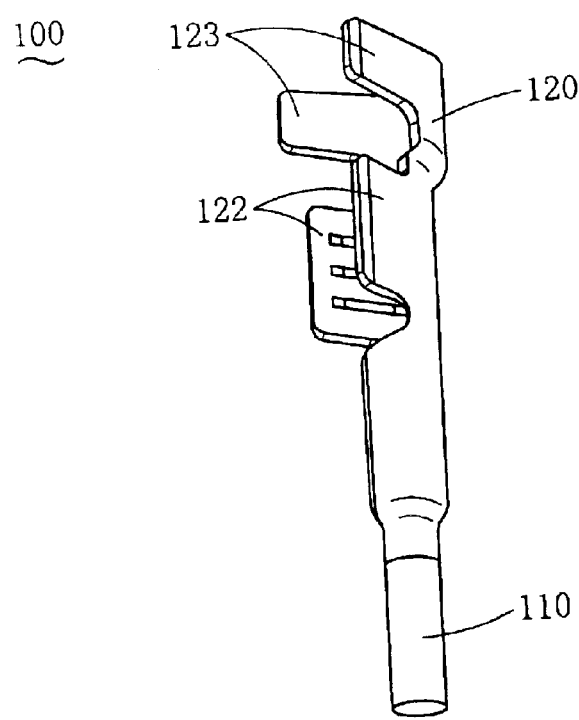
FIG. 6 is a perspective view of the electric contact of the second embodiment.

In the following, other embodiments will be described. When there is an embodiment which is closest to an embodiment to be described, the description of the former will be incorporated together with the reference characters. Then additional description will be provided regarding differences in structure from the closest embodiment. FIG. 6 shows the electric contact 100 of the second embodiment. The closest embodiment to this embodiment is the first embodiment. In this second embodiment, the connecting part 120 is formed to be connected to an electric wire 300, and to this end, the connecting part 120 is provided with wire barrels 122, which crimp the core wire 310 of the electric wire 300, and with insulation barrels 123, which crimp the covering 320. In this embodiment, the protruding part 110 is made of the lead free ultrahigh conductive plastic, and other parts are made of a metal such as a copper alloy. The connection between the protruding part 110 and other parts is made by, for example, thermal welding or adhesion.

Figure 7:
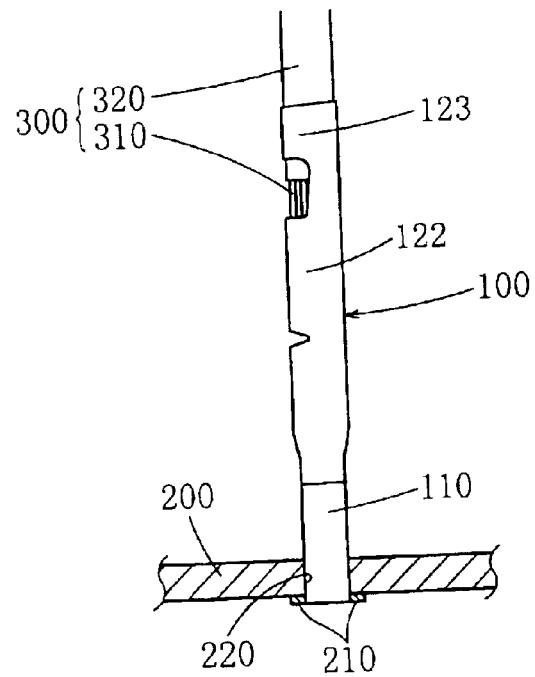
FIG. 7 is a front view of the electric contact of the second embodiment, which is mounted on a printed circuit board. The printed circuit board is sectioned.

As for the electric contact of the second embodiment, the electric wire 300 being the counterpart member is connected to the connecting part 120 by crimping the core wire 310 and the covering 320 of the electric wire 300 with the wire barrels 122 and the insulation barrels 123 (refer to FIG. 7). In that case, as the parts other than the protruding part 110 are made of a metal, the strength and elasticity of these parts are increased. In particular, the wire barrels 122 and the insulation barrels 123 get easier to bend and harder to break, allowing easier crimping. Other functions and effects are similar to those of the first embodiment.

Figure 8:
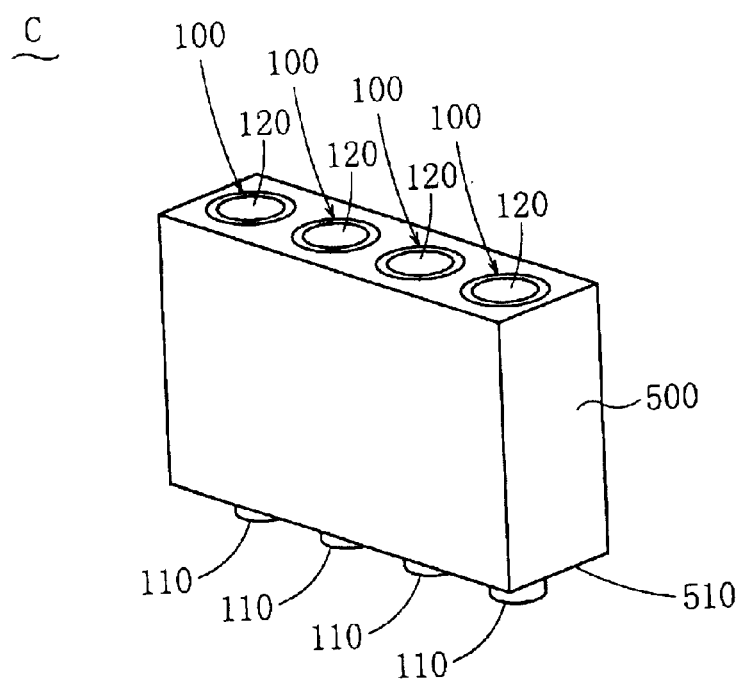
FIG. 8 is a perspective view of an electric connector using the electric contact of the first embodiment.

FIG. 8 shows the electric connector, which uses the electric contact 100 of the first embodiment. This electric connector C comprises the electric contacts 100 of the first embodiment and an insulating housing 500, which holds the electric contacts 100. The protruding parts 110 protrude outwards from the insulating housing 500. The connecting parts 120 are exposed from the insulating housing 500 so that conductors of counterpart members can be connected to them. This embodiments is provided with four electric contacts 100. But the number of poles is not limited by this embodiment. The insulating housing 500 is made of a thermoplastic resin, and the electric contacts 100 and the insulating housing 500 are molded integrally. A positioning plane 510, which contacts the printed circuit board 200, is formed at the root of the protruding parts 110 on the insulating housing 500.

Figure 9:
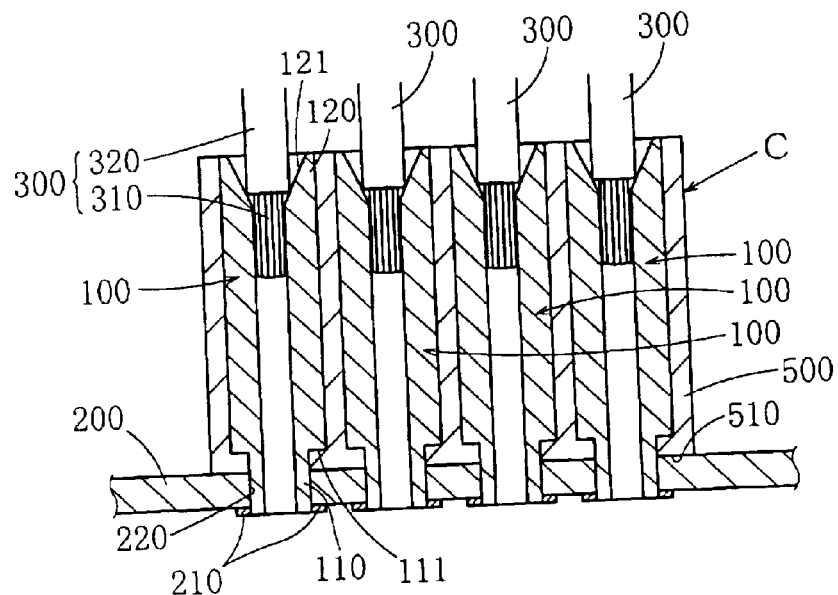
FIG. 9 is a sectional view of the electric connector using the electric contact of the first embodiment, which is mounted on a printed circuit board.

As shown in FIG. 9, when the electric contacts 100 of this electric connector C are connected to the printed circuit board 200 at the protruding parts 110, which protrude outwards from the insulating housing 500, and the connecting parts 120 are connected to the core wires 310 of the electric wires 300, the electric connector C will be mounted on the printed circuit board 200. In that case, the functions and effects which the electric contacts 100 exhibit are similar to those of the first embodiment.

The present invention does not limit the material of the insulating housing to thermoplastic resins. The present invention also includes embodiments wherein the electric contacts are assembled in an insulating housing by, for example, insertion. Among the embodiments of the present invention, in the electric connector C of the above-mentioned embodiment, the insulating housing 500 is made of a thermoplastic resin, and the electric contacts 100 and the insulating housing 500 are molded integrally. With this arrangement, as the electric connector C is produced by injection molding or the like, the efficiency of production is higher in comparison with a case wherein the electric contacts 100 and the insulating housing 500 are produced separately and they are assembled together. Thus it is suited to mass production.

The present invention includes embodiments wherein no difference in level is provided at the root of the protruding parts. Among the embodiments of the present invention, in the electric connector C of the above-mentioned embodiment, the positioning plane 510, which contacts the printed circuit board 200, is formed at the root of the protruding parts 110. With this arrangement, as shown in FIG. 9, when the protruding parts 110 are inserted into the through holes 220 of the printed circuit board 200, the positioning plane 510 will contact the printed circuit board 200 and will not be inserted any more. Thus the length of insertion is neither too much nor too less, and the reliability of connection is enhanced.

Figure 10:
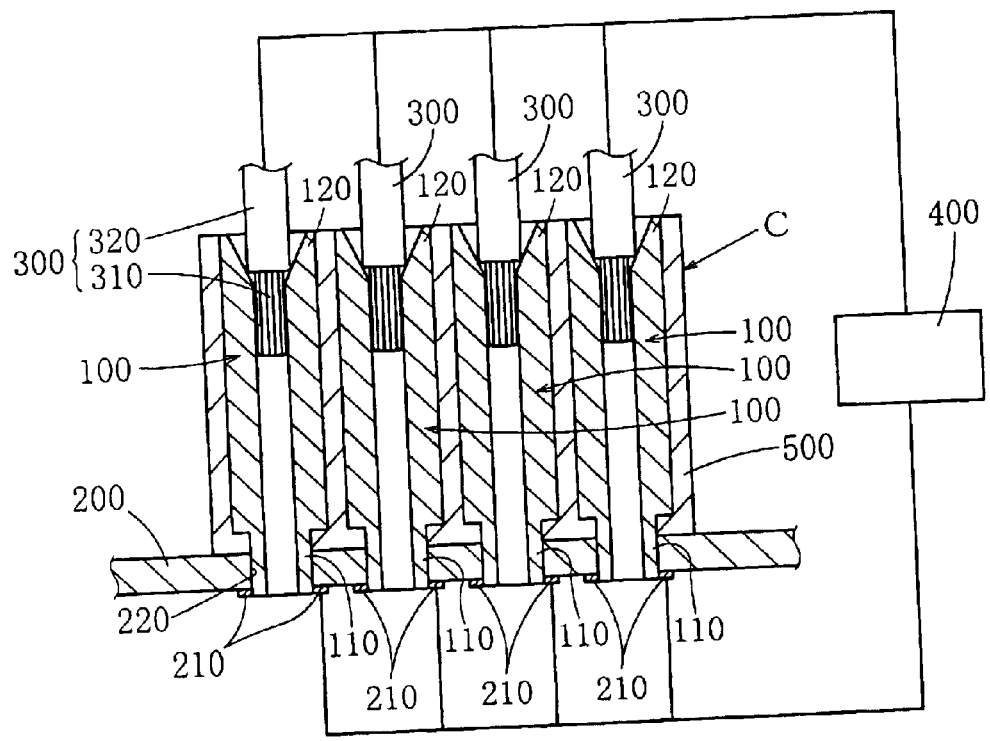
FIG. 10 is a schematic diagram showing another embodiment of the method of connecting the electric connector using the electric contact of the first embodiment to the printed circuit board.

Another embodiment of the method of connecting this electric connector C to the printed circuit board 200 will be described. As shown in FIG. 10, first, the protruding parts 110 of the electric contacts 100 are inserted into the through holes 220 of the printed circuit board 200. Next, electricity is passed between the electric contacts 100 and the conductors 210 of the printed circuit board 200 by a power source 400 to melt the lead-free solder being contained in the protruding parts 110 and connect the electric contacts 100 to the conductors 210.

When this connecting method is used, as the protruding parts 110 generate heat by themselves, even when it is difficult to externally heat the protruding parts 110, due to, for example, interference by the insulating housing 500, the electric contacts 100 can be connected to the conductors 210 of the printed circuit board 200. In this case, the two poles of the power source 400 are connected to the electric contracts 100 and the conductors 210 of the printed circuit board 200, but as shown in FIG. 10, one pole may be connected to the core wires 310 of the electric wires 300, which are inserted into the connecting parts 120. With this arrangement, in the case of this embodiment, as the connecting parts 120 are also made of the lead-free ultrahigh-conductive plastic, the lead-free solder being contained in the connecting parts 120 will melt and connect the core wires 310 to the connecting parts 120.

Figure 11:
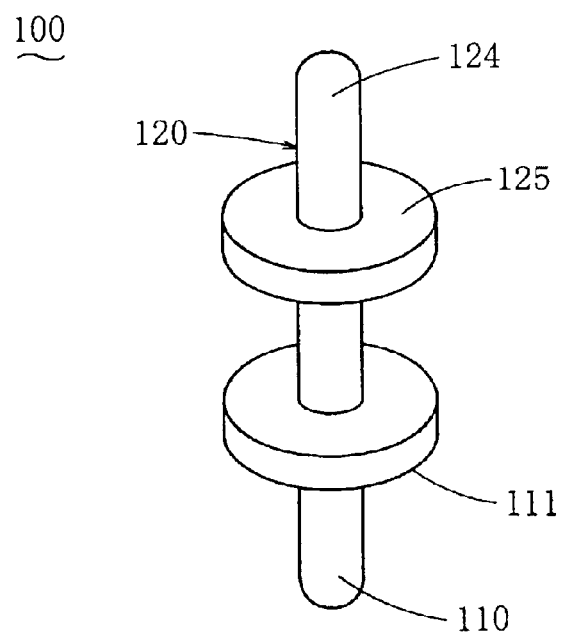
FIG. 11 is a perspective view of the electric contact of the third embodiment.

FIG. 11 shows the electric contact 100 of the third embodiment. This electric contact 100 electrically connects two printed circuit boards to each other. The closest embodiment to this embodiment is the first embodiment. What differs in the construction from the electric contact 100 of the first embodiment is that the counterpart member is a counterpart printed circuit board, which has a conductor that is provided on the surface or in an intermediate layer and a through hole or a concaved part, of which internal wall contacts the conductor, and that the connecting part has a protruding part, which is inserted into a through hole or a concaved part of the counterpart printed circuit board. The construction of the counterpart printed circuit board 200 is similar to the construction of the original printed circuit board 200, and a conductor 210 and a through hole 220 are provided. The construction of the protruding part 124, which is a part of the connecting part 120, is similar to that of the protruding part 110, which is inserted into the through hole 220 of the original printed circuit board 200. In other words, the protruding part 124 is formed into a bar and its length is set so that when the protruding part 124 is inserted into the through hole 220 of the printed circuit board 200, the top end of the protruding part 124 will contact the conductor 210 of the printed circuit board 200. A positioning plane 125, which contacts the printed circuit board 200, is formed at the root of the protruding part 110. The positioning plane 125 is formed by providing a flange and using its surface, but the positioning plane 125 may be formed by making a difference in level, like that of the first embodiment. The electric contact 100 is entirely made of the lead-free ultrahigh-conductive plastic being the conductive resin composite. The present invention includes electric contacts wherein at least the part of the protruding part, which connects to the conductor of the printed circuit board, is made of the lead-free ultrahigh-conductive plastic and other parts are made of another material having conductivity.

Figure 12:
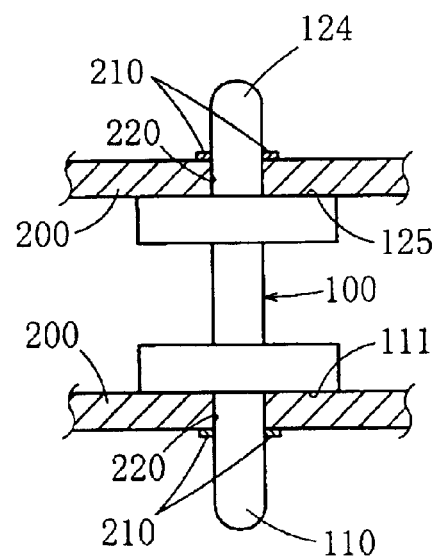
FIG. 12 is a front view of the electric contact of the third embodiment, which is mounted on printed circuit boards. The printed circuit boards are sectioned.

As for the electric contact of the third embodiment, as shown in FIG. 12, when the protruding part 110 of the electric contact 100 is inserted into the through hole 220 of the original printed circuit board 200 and the protruding part 110 is heated, the lead-free solder being contained in the lead-free ultrahigh-conductive plastic of the protruding part 110 will melt out and stick to the conductor 210 of the printed circuit board 200. When the solder cools and solidifies, the electric contact 100 will be mounted on the printed circuit board 200. Further, when the protruding part 124 of the connecting part 120 of the electric contact 100 is inserted into the through hole 220 of the counterpart printed circuit board 200 and the protruding part 124 is heated, the lead-free solder being contained in the lead-free ultrahigh-conductive plastic of the protruding part 124 will melt out and stick to the conductor 210 of the printed circuit board 200. When the solder cools and solidifies, the electric contact 100 will be mounted on the printed circuit board 200. Thus the conductors of the two printed circuit boards will be connected by the electric contact. The functions and effects which are exhibited in that case are similar to those of the first embodiment. Other modes of forming the connecting part for connection to the counterpart printed circuit board include a mode wherein the surface of the connecting part is formed into a simple face that contacts the conductor of the counterpart printed circuit board, and the present invention includes this mode. In contrast to this mode, the third embodiment has a merit that the printed circuit boards are reliably positioned to each other.

Figure 13:
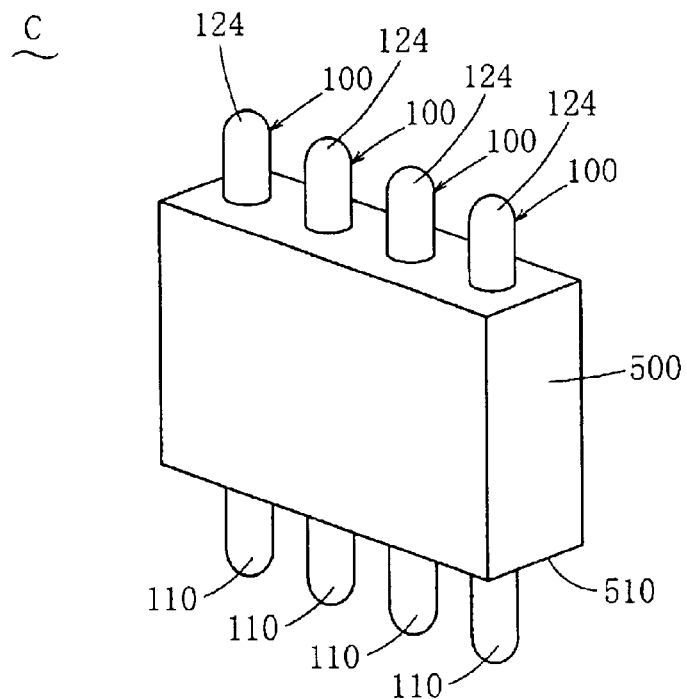
FIG. 13 is a perspective view of an electric connector using the electric contact of the third embodiment.

FIG. 13 shows an embodiment of the electric connector, which uses the electric contact 100 of the third embodiment. This electric connector C comprises a modification, which is obtained by eliminating the flanges from the electric contact 100 of the third embodiment, and an insulating housing 500, which holds the electric contact 100. The protruding part 110 protrudes outwards from the insulating housing 500. The connecting part 120 is exposed from the insulating housing 500 so that the conductor of the counterpart member can be connected to the connecting part 120. Four electric contacts 100 are provided in this embodiment, but the number of poles is not limited by this embodiment. The insulating housing 500 is made of a thermoplastic resin, and the electric contacts 100 and the insulating housing 500 are molded integrally. A positioning plane 510, which contacts the printed circuit board 200, is formed at the root of the protruding parts 110 on the insulating housing 500.

Figure 14:
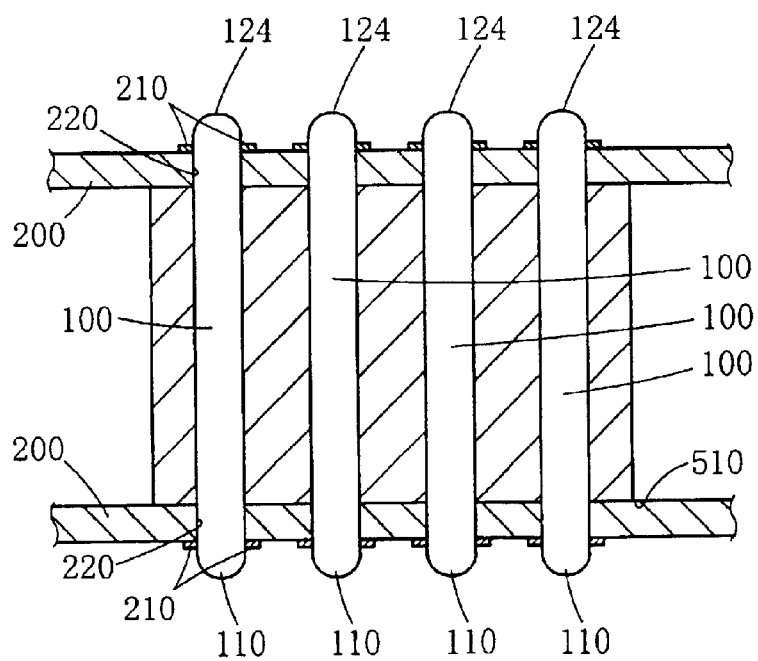
FIG. 14 is a partial sectional view of the electric connector using the electric contact of the third embodiment, which is mounted on a printed circuit board. The electric contacts are not sectioned.

As shown in FIG. 14, when the electric contacts 100 of this electric connector C are connected to the original printed circuit board 200 at the protruding parts 110 protruding outwards from the insulating housing 500, and the electric contacts 100 thereof are connected to the counterpart printed circuit board 200 at the protruding parts 124 of the connecting parts 120, which protrude outwards from the insulating housing 500, the electric connector C will be mounted on both the printed circuit boards 200. The functions and effects which are exhibited by the electric contacts 100 in that case are similar to those of the electric connector C which uses the electric contacts 100 of the first embodiment.

Figure 15:
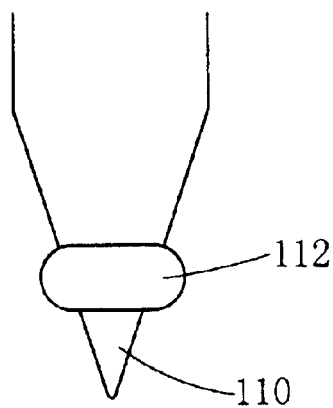
FIG. 15 is an enlarged front view of the protruding part of the electric contact of the fourth embodiment.
Figure 16:
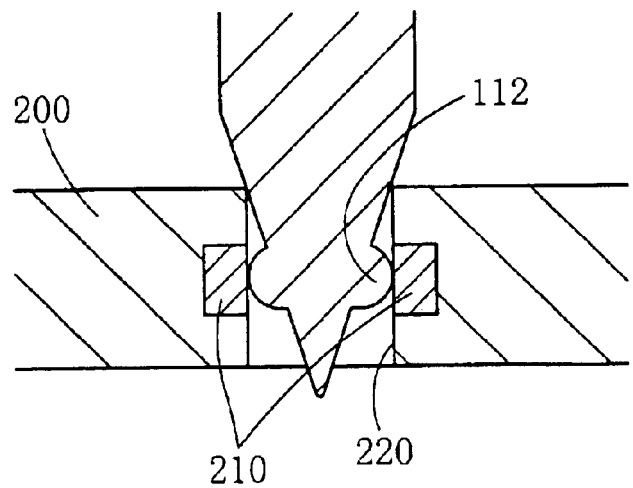
FIG. 16 is a sectional view of the electric contact of the fourth embodiment, which is mounted on a printed circuit board.

In the electric contacts 100 of the fourth embodiment through the sixth embodiment, which will be described below, the protruding parts 110 are formed into configurations which are suited to being pressed into the through holes 220. The closest embodiment to these embodiments is the first embodiment. FIG. 15 shows the electric contact 100 of the fourth embodiment. The protruding part 110 of this electric contact 100 is formed into a cone, which generally gets thinner towards the top end, so that it can be easily inserted into the through hole 220. A rib 112 is formed over the entire circumference of the protruding part 110. The conductor 210 of the printed circuit board 200 is provided not on the surface but in an intermediate layer. The dimensions of the rib 112 are set so that the rib 112 is pressed into the through hole 220. Accordingly, as shown in FIG. 16, when the protruding part 110 is inserted into the through hole 220, the protruding part 110 will be pressed into the through hole 220, with the rib 112 contacting the conductor 210. Under this condition, a part of the protruding part 110 on the root side of the rib 112 will contact the opening of the through hole 220, and the protruding part 110 will not be inserted any more. Thus the length of insertion is neither too much nor too less, and the reliability of connection is enhanced.

Figure 17:
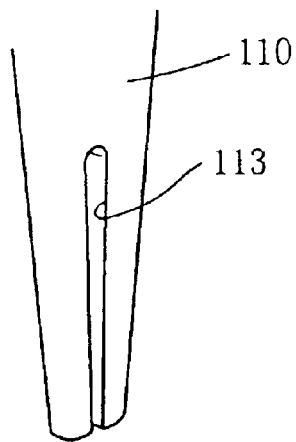
FIG. 17 is an enlarged perspective view of the protruding part of the electric contact of the fifth embodiment.
Figure 18:
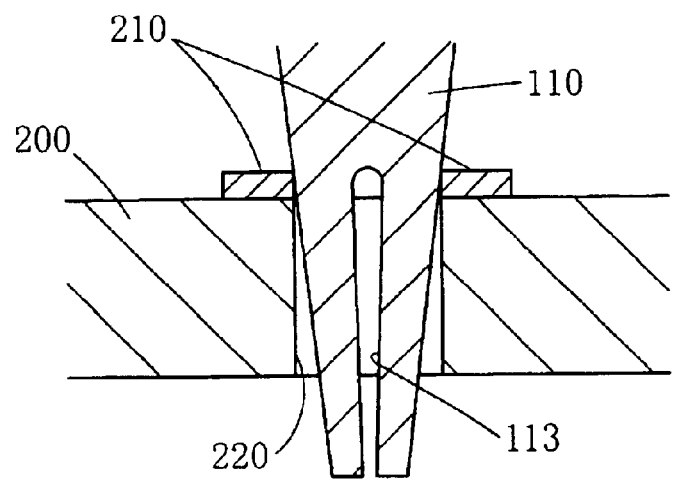
FIG. 18 is a sectional view of the electric contact of the fifth embodiment, which is mounted on a printed circuit board.

FIG. 17 shows the electric contact 100 of the fifth embodiment. The protruding part 110 of this electric contact 100 is formed into a cone, which generally gets thinner towards the top end thereof, so that it can be easily inserted into the through hole 220. A slit 113, which extends to the top, is made to split the protruding part 110 into two branches. The conductor 210 of the printed circuit board 200 is provided on the surface which is opposite to that of the first embodiment. Accordingly, as shown in FIG. 18, when the protruding part 110 is inserted into the through hole 220, the protruding part 110 will undergo elastic deformation and be pressed into the through hole 220, and the protruding part 110 will contact the conductor 210. Under this condition, the root of the protruding part 110 will contact the opening of the through hole 220, and the protruding part 110 will not be inserted any more. Thus the length of insertion is neither too much nor too less, and the reliability of connection is enhanced.

Figure 19:
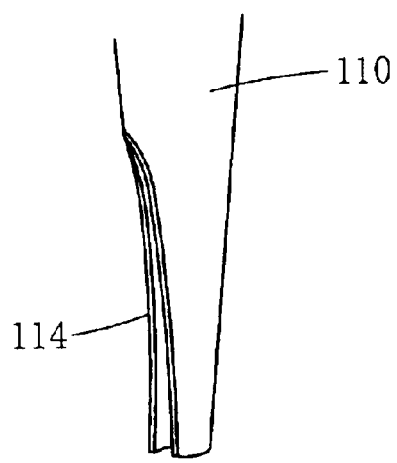
FIG. 19 is an enlarged perspective view of the protruding part of the electric contact of the sixth embodiment.
Figure 20:
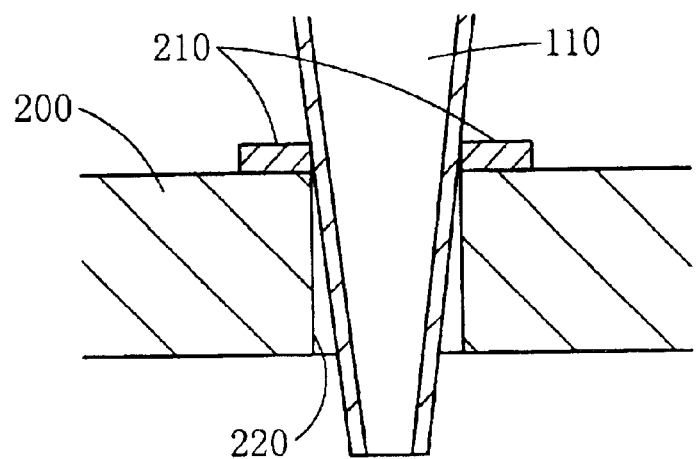
FIG. 20 is a sectional view of the electric contact of the sixth embodiment, which is mounted on a printed circuit board.

FIG. 19 shows the electric contact 100 of the sixth embodiment. The protruding part 110 of this electric contact 100 is formed into a cone, which generally gets thinner towards the top end, so that the protruding part 110 can be easily inserted into the through hole 220. Moreover, it is made hollow. Its side face is cut to form an opening 114. The conductor 210 of the printed circuit board 200 is provided on the surface which is opposite to that of the first embodiment. Accordingly, as shown in FIG. 20, when the protruding part 110 is inserted into the through hole 220, the protruding part 110 will undergo elastic deformation and will be pressed into the through hole 220, and the protruding part 110 will contact the conductor 210. Under this condition, the root of the protruding part 110 will contact the opening of the through hole 220, and the protruding part 110 will not be inserted any more. Thus the length of insertion is neither too much nor too less, and the reliability of connection is enhanced.

As the lead-free ultrahigh-conductive plastic can be molded by injection molding, it has a high degree of freedom in molding. Hence, like the fourth embodiment through the sixth embodiment, a part or the entirety of the protruding part 110 can be easily formed into a configuration which is suited to being pressed into the through hole 220, and this does not cause an increase in cost due to complication of the production processes. In such a case, the electric contact 100 can be mounted on the printed circuit board 200 by simply pressing the protruding part 110 into the through hole 220. In that case, when the protruding part 110 is heated, the strength of connection between the protruding part 110 and the conductor 210 of the printed circuit board 200 will be enhanced by the above-mentioned connecting function of the lead-free solder.

When the counterpart member is an electric contact and the connecting part is made of the lead-free ultrahigh-conductive plastic, it is preferable to form a plated layer for increasing the hardness on the surface of the connecting part. With this arrangement, the surface hardness of the connecting part is increased, and even if the connecting part is subjected to frictional forces, for example, by repeated insertion and extraction of the counterpart electric contact, its wear will be restrained. Thus the durability will be enhanced. The present invention includes embodiments wherein features of the embodiments mentioned so far are combined.

With the description of these embodiments, the first electric contact using resin solder, which was described in the summary of the invention, has been fully disclosed. Moreover, with the description of these embodiments, the second through fourth electric contacts using resin solder, the method of connecting these electric contacts using resin solder to a printed circuit board, the first through third electric connectors using resin solder, and the method of connecting these electric connectors using resin solder to a printed circuit board, which will be described below, have been fully explained.

The second electric contact using resin solder is the above-mentioned first electric contact using resin solder, wherein the counterpart member is an electric wire and the connecting part is formed to be connected to the electric wire.

With this arrangement, the electric wire is connected, via the electric contact, to the conductor of the printed circuit board. In that case, when at least the part of the connecting part, which is connected to the conductor of the electric wire, is made of the lead-free ultrahigh-conductive plastic, the electric wire can be connected to the connecting part by the above-mentioned connecting function of the lead-free solder. As the work of separately applying solder is not required, even when it is difficult or impossible to solder the connecting part, for example, when the connecting part is at a recess of the electric contact, the electric wire can be easily connected to the connecting part. Moreover, as solder quality control, temperature control and the like are not required, the control man-hour is reduced. Further, the connection of a very fine wire can be done by an automatic machine, and the productivity is enhanced and the cost is reduced. Moreover, a larger current can be passed. As the degree of freedom in molding is high, the part of the connecting part, which is made of the lead-free ultrahigh-conductive plastic, can be molded into a variety of configurations according to applications.

The third electric contact using resin solder is the first electric contact using resin solder, wherein the counterpart member is a counterpart printed circuit board, which has a conductor being provided on a surface or in an intermediate layer and a through hole or a concaved part, of which an inner wall contacts the conductor, and the connecting part has a protruding part, which is inserted into the through hole or the concaved part of the counterpart printed circuit board.

With this arrangement, conductors of two printed circuit boards are connected to each other by the electric contact. In that case, when at least the part of the protruding part, which connects to the conductor of the counterpart printed circuit board, is made of the lead-free ultrahigh-conductive plastic, the functions and effects which are obtained by the first electric contact using resin solder can be obtained between the connecting part and the counterpart printed circuit board.

The fourth electric contact using resin solder is any one of the first through third electric contacts using resin solder, wherein a positioning plane, which contacts the printed circuit board, is formed at a root of the protruding part.

With this arrangement, when the protruding part is inserted into the through hole or the concaved part of the printed circuit board, the positioning plane will contact the printed circuit board, and the protruding part will not be inserted any more. Thus the length of insertion is neither too much nor too less, and the reliability of connection is enhanced.

The method of connecting any one of the first through fourth electric contacts using resin solder to the printed circuit board comprises inserting the protruding part of the electric contact using resin solder into the through hole or the concaved part of the printed circuit board, and passing electricity between the electric contact and the conductor of the printed circuit board to melt the lead-free solder being contained in the protruding part and connect the electric contact to the conductor.

When this connecting method is used, as the protruding part generates heat by itself, even when it is difficult to externally heat the protruding part, the electric contact can be connected to the conductor of the printed circuit board.

The first electric connector using resin solder comprises any one of the first through fourth electric contacts using resin solder and an insulating housing, which holds the electric contact.

When the electric contact of this electric connector is connected to the printed circuit board at the protruding part, which protrudes outwards from the insulating housing, and the connecting part is connected to the conductor of the counterpart member, the electric connector will be mounted on the printed circuit board. The functions and effects are similar to those which can be obtained by any one of the first through fourth electric contacts using resin solder.

The second electric connector using resin solder is the first electric connector using resin solder, wherein the insulating housing is made of a thermoplastic resin and the electric contact and the insulating housing are molded integrally.

With this arrangement, as the electric connector is produced by injection molding or the like, the efficiency of production is higher than the case wherein the electric contact and the insulating housing are produced separately and they are assembled together. Thus it is suited to mass production.

The third electric connector using resin solder is the first or second electric connector using resin solder, wherein a positioning plane, which contacts the printed circuit board, is formed at a root of the protruding part.

With this arrangement, when the protruding part is inserted into the through hole or the concaved part of the printed circuit board, the positioning plane will contact the printed circuit board, and the protruding part will not be inserted any more. Thus the length of insertion is neither too much nor too less, and the reliability of connection is enhanced.

The method of connecting any one of the first through third electric connectors using resin solder to the printed circuit board comprises inserting the protruding part of the electric contact using resin solder into the through hole or the concaved part of the printed circuit board, and passing electricity between the electric contact and the conductor of the printed circuit board to melt the lead-free solder being contained in the protruding part and connect the electric contact to the conductor.

When this connecting method is used, as the protruding part generates heat by itself, even when it is difficult to externally heat the protruding part, for example, due to interference by the housing, the electric contact can be connected to the conductor of the printed circuit board.

What is claimed is:

1. An electric contact using resin solder, which is connected to a first printed circuit board, which has a first conductor being provided on a first surface or in a first intermediate layer of the first printed circuit board and a first through hole or a first concaved part, which penetrates the first conductor, the electric contact comprising a first protruding part, which is inserted into the first through hole or the first concaved part of the first printed circuit board, and a connecting part, which is connected to a second conductor of a counterpart member, and at least a part of the first protruding part, which connects to the first conductor of the first printed circuit board, is made of a lead-free ultrahigh-conductive plastic being a conductive resin composite, comprising a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal, wherein the counterpart member is a counterpart printed circuit board, which has a second conductor being provided on a second surface or in a second intermediate layer of the counterpart printed circuit board and a second through hole or a second concaved part, of which an inner wall contacts the second conductor, and the connecting part has a second protruding part, which is inserted into the second through hole or the second concaved part of the counterpart printed circuit board.

2. An electric contact using resin solder as recited in claim 1, wherein a first positioning plane, which contacts the first printed circuit board, is formed at a root of the first protruding part.

3. An electric contact using resin solder as recited in claim 2, wherein a second positioning plane, which contacts the counterpart printed circuit board, is formed at a root of the second protruding part.

4. An electric connector using resin solder comprising the electric contact using resin solder as recited in claim 3 and an insulating housing, which holds the electric contact.

5. An electric connector using resin solder comprising the electric contact using resin solder as recited in claim 2, and an insulating housing, which holds the electric contact.

6. A method of connecting the electric contact using resin solder as recited in claim 1 to the first printed circuit board, the method comprising inserting the first protruding part of the electric contact using resin solder into the first through hole or the first concaved part of the first printed circuit board, and passing electricity between the electric contact and the first conductor of the first printed circuit board to melt the lead-free solder being contained in the first protruding part and connect the electric contact to the first conductor.

7. An electric connector using resin solder comprising the electric contact using resin solder as recited in claim 1 and an insulating housing, which holds the electric contact.

8. An electric connector using resin solder as recited in claim 7, wherein the insulating housing is made of a thermoplastic resin, and the electric contact and the insulating housing are molded integrally.

9. An electric connector using resin solder as recited in claim 8, wherein a positioning plane, which contacts the first printed circuit board, is formed at a root of the first protruding part.

10. A method of connecting the electric connector using resin solder of claim 7 to the first printed circuit board, the method comprising inserting the first protruding part of the electric contact using resin solder into the first through hole or the first concaved part of the first printed circuit board, and passing electricity between the electric contact and the first conductor of the first printed circuit board to melt the lead-free solder being contained in the first protruding part and connect the electric contact to the first conductor.

11. An electric connector comprising an electric contact adapted to connect first and second printed circuit boards to one another, wherein the first printed circuit board has a first conductor provided on a first surface or a first intermediate layer thereof and a first through hole or a first recess that adjoins the first conductor, the second printed circuit board has a second conductor provided on a second surface or a second intermediate layer thereof and a second through hole or a second recess that adjoins the second conductor, and the electric contact comprises:

a first protruding part that is adapted to be inserted into the first through hole or the first recess and that includes a first contact part adapted to contact and connect to the first conductor; and a second protruding part that is connected to the first protruding part and adapted to be inserted into the second through hole or the second recess and that includes a second contact part adapted to contact and connect to the second conductor;

wherein at least the first contact part comprises a lead-free ultrahigh-conductive plastic resin composite comprising a thermoplastic resin, a lead-free solder that has a melting temperature no higher than that of the thermoplastic resin so that the lead-free solder melts when the thermoplastic resin is heat-plasticated, and a metal powder that assists a fine dispersion of the lead-free solder in the thermoplastic resin or a mixture of the metal powder and metal short fibers.

12. The electric connector according to claim 11, wherein the first and second protruding parts are respectively disposed at opposite ends of a straight contact pin.

13. The electric connector according to claim 12, further comprising two flanges that radially protrude from the straight contact pin and that are spaced apart from one another and from respective free terminating ends of the first and second protruding parts.

14. The electric connector according to claim 13, wherein the electric contact entirely consists of the lead-free ultrahigh-conductive plastic resin composite.

15. The electric connector according to claim 11, further comprising an electrically insulative housing, wherein the first and second protruding parts are connected to each other through the housing and respectively protrude on opposite sides from the housing.

16. An electrically connected combination including first and second printed circuit boards and an electric contact, wherein:

the first printed circuit board has a first conductor provided on a first surface or a first intermediate layer thereof and a first through hole or a first recess that adjoins the first conductor;

the second printed circuit board has a second conductor provided on a second surface or a second intermediate layer thereof and a second through hole or a second recess that adjoins the second conductor;

the electric contact comprises:

a first protruding part that is inserted into the first through hole or the first recess and that includes a first contact part contacting and connected to the first conductor, and a second protruding part that is connected to the first protruding part and inserted into the second through hole or the second recess and that includes a second contact part contacting and connected to the second conductor; and at least the first contact part comprises a lead-free ultrahigh-conductive plastic resin composite comprising a thermoplastic resin, a lead-free solder that has a melting temperature no higher than that of the thermoplastic resin so that the lead-free solder melts when the thermoplastic resin is heat-plasticated, and a metal powder that assists a fine dispersion of the lead-free solder in the thermoplastic resin or a mixture of the metal powder and metal short fibers.

17. The electrically connected combination according to claim 16, wherein the electric contact entirely consists of the lead-free ultrahigh-conductive plastic resin composite.

18. The electrically connected combination according to claim 16, wherein the first and second protruding parts are respectively disposed at opposite ends of a straight contact pin.

19. The electrically connected combination according to claim 18, wherein the electric contact further comprises two flanges that radially protrude from the straight contact pin and that are spaced apart from one another and from respective free terminating ends of the first and second protruding parts, and wherein the two flanges are received between and respectively seated against the first and second printed circuit boards.

20. The electrically connected combination according to claim 16, further comprising an electrically insulative housing for the electric contact, wherein the first and second protruding parts are connected to each other through the housing and respectively protrude on opposite sides from the housing, and wherein the housing is received between and seated against the first and second printed circuit boards.

* * * * *

UNITED STATES PATENT AND TRADEMARK OFFICE
CERTIFICATE OF CORRECTION

PATENT NO. : 6,818,839 B2
DATED : November 16, 2004
INVENTOR(S) : Hosaka et al.

It is certified that error appears in the above-identified patent and that said Letters Patent is hereby corrected as shown below:

Column 1,
Line 5, insert
-- CROSS-REFERENCE TO RELATED APPLICATIONS
This application is related to our copending U.S. Patent Applicaitons USSN: 10/114,196; 10/114,197; 10/114,198; 10/114,775; and 10/114, 799, all filed on April 1, 2002. --.

Column 5,
Line 50, before "and", replace "2800° C.," by -- 280° C., --.

Column 6,
Line 24, after "220° C.", insert:
-- This mixture was kneaded, without preheating time, at a rate ranging from 25 to 50 r.p.m. for 20 minutes; the resin was heat-plasticated and the solder, under half-melted condition, was dispersed throughout the resin. --.

Signed and Sealed this

Twenty-sixth Day of April, 2005

JON W. DUDAS
*Director of the United States Patent and Trademark Office*